(12) United States Patent
Bito et al.

(10) Patent No.: US 11,237,223 B2
(45) Date of Patent: Feb. 1, 2022

(54) MAGNETIC FLUX CONCENTRATOR FOR IN-PLANE DIRECTION MAGNETIC FIELD CONCENTRATION

(71) Applicant: TEXAS INSTRUMENTS INCORPORATED, Dallas, TX (US)

(72) Inventors: Jo Bito, Dallas, TX (US); Benjamin Stassen Cook, Addison, TX (US); Dok Won Lee, Mountain View, CA (US); Keith Ryan Green, Prosper, TX (US); Ricky Alan Jackson, Richardson, TX (US); William David French, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 209 days.

(21) Appl. No.: 16/521,053

(22) Filed: Jul. 24, 2019

(65) Prior Publication Data
US 2021/0025948 A1    Jan. 28, 2021

(51) Int. Cl.
*G01R 33/00* (2006.01)
*G01R 33/07* (2006.01)
*B32B 15/04* (2006.01)
*G01D 5/14* (2006.01)
*G01R 15/20* (2006.01)
*G01R 33/06* (2006.01)
*G01R 21/08* (2006.01)
*G01R 33/02* (2006.01)

(52) U.S. Cl.
CPC ......... *G01R 33/0011* (2013.01); *G01R 33/07* (2013.01); *B32B 15/04* (2013.01); *B32B 2307/206* (2013.01); *B32B 2307/208* (2013.01); *B32B 2457/00* (2013.01); *G01D 5/142* (2013.01); *G01R 15/20* (2013.01); *G01R 15/202* (2013.01); *G01R 21/08* (2013.01); *G01R 33/0094* (2013.01); *G01R 33/02* (2013.01); *G01R 33/06* (2013.01); *G01R 33/077* (2013.01)

(58) Field of Classification Search
CPC ............................ G01R 33/07; G01R 33/0011
See application file for complete search history.

(56) References Cited

U.S. PATENT DOCUMENTS

| 4,398,342 | A | 8/1983 | Pitt et al. |
| 4,587,509 | A | 5/1986 | Pitt et al. |
| 5,942,895 | A | 8/1999 | Popovic |

(Continued)

FOREIGN PATENT DOCUMENTS

RU    2656237    6/2018

OTHER PUBLICATIONS

International Search Report in corresponding PCT Application No. PCT/US2020/049640, dated Oct. 29, 2020 (2 pages).

(Continued)

*Primary Examiner* — Reena Aurora
(74) *Attorney, Agent, or Firm* — John R. Pessetto; Charles A. Brill; Frank D. Cimino

(57) ABSTRACT

A structure includes a substrate which includes a surface. The structure also includes a horizontal-type Hall sensor positioned within the substrate and below the surface of the substrate. The structure further includes a patterned magnetic concentrator positioned above the surface of the substrate, and a protective overcoat layer positioned above the magnetic concentrator.

8 Claims, 10 Drawing Sheets

(56) References Cited

U.S. PATENT DOCUMENTS

| | | | |
|---|---|---|---|
| 9,164,156 B2 * | 10/2015 | Elian | G01R 33/091 |
| 9,419,206 B2 * | 8/2016 | Kim | G01R 33/07 |
| 10,620,277 B2 | 4/2020 | Schott | |
| 2009/0309590 A1 | 12/2009 | Kataoka | |
| 2014/0028305 A1 | 1/2014 | Gokmen | |
| 2018/0031645 A1 | 2/2018 | Burssens | |

OTHER PUBLICATIONS

International Search Report in corresponding PCT Application No. PCT/US2020/042731, dated Sep. 24, 2020 (2 pages).

* cited by examiner

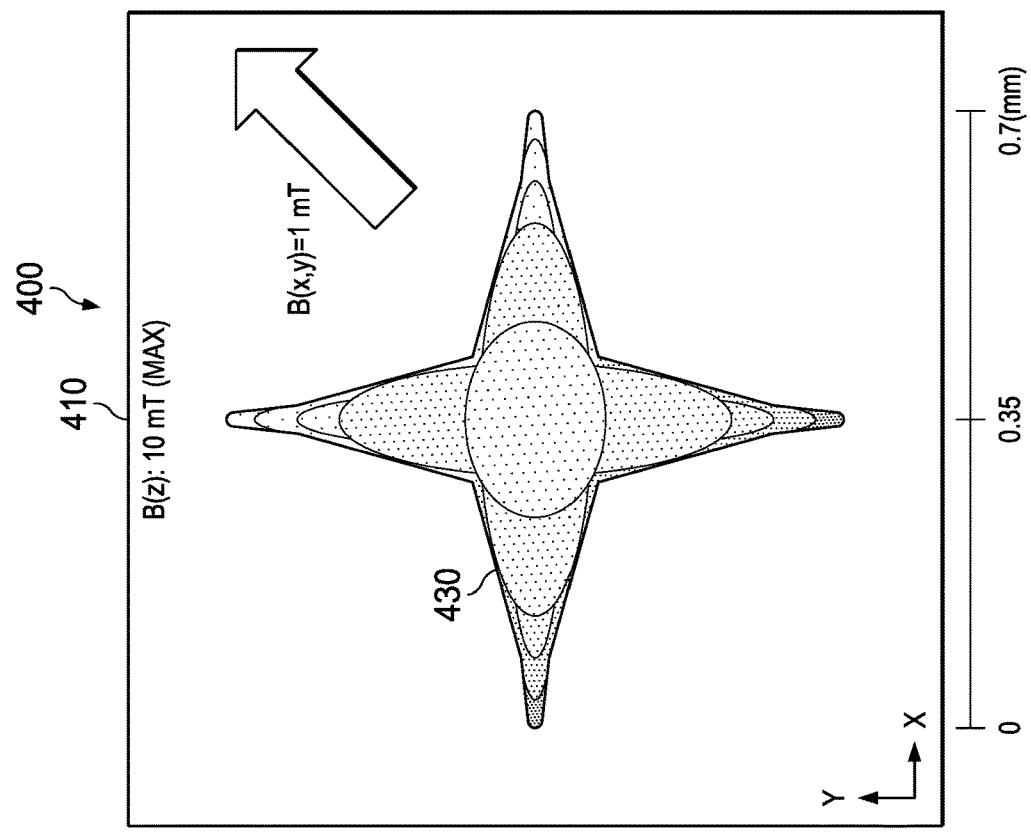
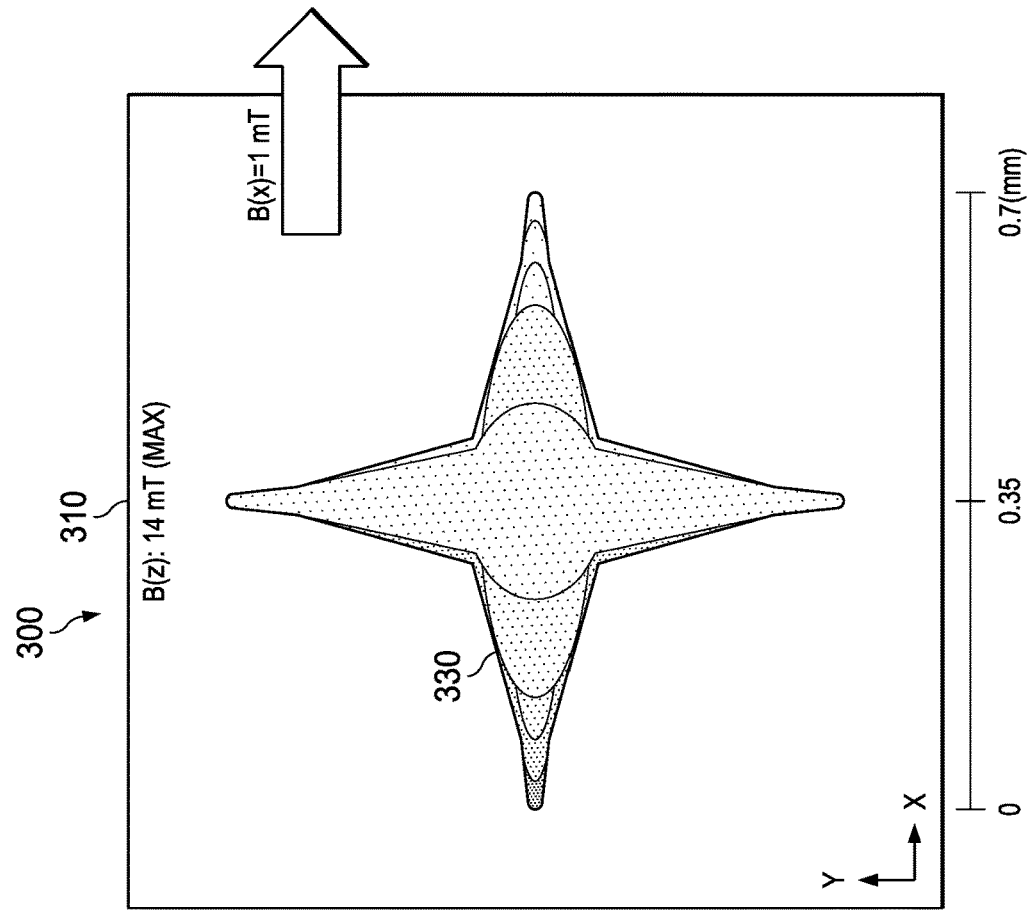
FIG. 4
FIG. 3

MAGNETIC FLUX CONCENTRATOR FOR IN-PLANE DIRECTION MAGNETIC FIELD CONCENTRATION

BACKGROUND

A two-dimensional (2D) speed and direction sensor employs both horizontal and vertical Hall sensors. A Hall sensor is used to measure the magnitude of a magnetic field. Its output voltage is directly proportional to the magnetic field strength through it. Hall sensors may be used for proximity sensing, positioning, speed detection, and current sensing applications. A 2D pulse encoder also employs horizontal Hall sensors, but with a sensitivity enhancing magnetic concentrator formed via package level deposition, such as via pick-and-place of a magnetic concentrator disk. The pick-and-place method has the magnetic concentrator disk formed separately from wafer processing and, because the magnetic concentrator disk needs to subsequently be picked up from the separate location and be transferred to and ultimately deposited on the wafer, the capability of magnetic concentrator patterning is prohibitive. Furthermore, with a package level magnetic concentrator deposition method employed, a Hall sensor-to-magnetic concentrator separation distance becomes large resulting in a diminished magnetic field intensity near the Hall sensor. Also, package-level deposition of a magnetic concentrator raises overall cost.

SUMMARY

In at least one example, a structure includes a substrate including a surface. The structure also includes a horizontal-type Hall sensor positioned within the substrate and below the surface of the substrate. The structure further includes a patterned magnetic concentrator positioned above the surface of the substrate, and a protective overcoat layer positioned above the magnetic concentrator.

In another example, a method of forming a structure includes forming a substrate including a surface, positioning a horizontal-type Hall sensor within the substrate and below the surface of the substrate, forming a magnetic concentrator above the surface of the substrate, and forming a protective overcoat layer above the magnetic concentrator.

In yet another example, a method includes applying a substantially horizontal magnetic field to a patterned magnetic concentrator which converts the substantially horizontal magnetic field to a substantially vertical magnetic field. The patterned magnetic concentrator is positioned below a protective overcoat layer and above a surface of a substrate. The substantially vertical magnetic field is applied to two horizontal-type Hall sensors positioned within the substrate and below the surface of the substrate. The method also includes sensing the substantially vertical magnetic field using the two horizontal-type Hall sensors.

BRIEF DESCRIPTION OF THE DRAWINGS

For a detailed description of various examples, reference will now be made to the accompanying drawings in which:

FIG. 3 is a top view of a structure including a magnetic concentrator in a shape of a cross, with a magnetic field input applied in a horizontal (X) direction. The protective overcoat layer is not shown.

FIG. 4 is a top view of a structure including a magnetic concentrator in a shape of a cross, with a magnetic field input applied in a diagonal (x-y) direction. The protective overcoat layer is not shown.

DETAILED DESCRIPTION

An aspect of this description is to increase the sensitivity of a Hall sensor with a combination of a magnetic concentrator and at least one horizontal Hall sensor. A Hall sensor is a device that is used to measure the magnitude of a magnetic field. Its output voltage is directly proportional to the magnetic field strength through it. Hall sensors are used for proximity sensing, positioning, speed detection, direction detection, rotation detection, and current sensing applications. Hall sensors may be employed in a magnetic switch or in a rotational switch or shifter, where a Hall sensor measures the change in direction or rotation of the switch or shifter.

A horizontal Hall sensor has a longitudinal axis that is horizontal and parallel with respect to a substrate's flat upper surface also extending in the horizontal direction. Likewise, a vertical Hall sensor has a longitudinal axis that is vertical and perpendicular with respect to a substrate's flat upper horizontal surface. A horizontal Hall sensor measures the vertical magnetic field, and conversely, a vertical Hall sensor measures the horizontal magnetic field. The use of the terms "horizontal" and "vertical" is not to be interpreted as being limited with reference to only the ground. It is to be interpreted with respect to the elements of the structure. For example, the structure in FIG. 1 may be rotated, for example, 90°. With this rotation, the horizontal Hall sensors 120 would still be considered "horizontal Hall sensors" and would still measure the vertical magnetic field. Other terms such as "top", "bottom", "above", and "below" should be similarly interpreted.

Figure 1:
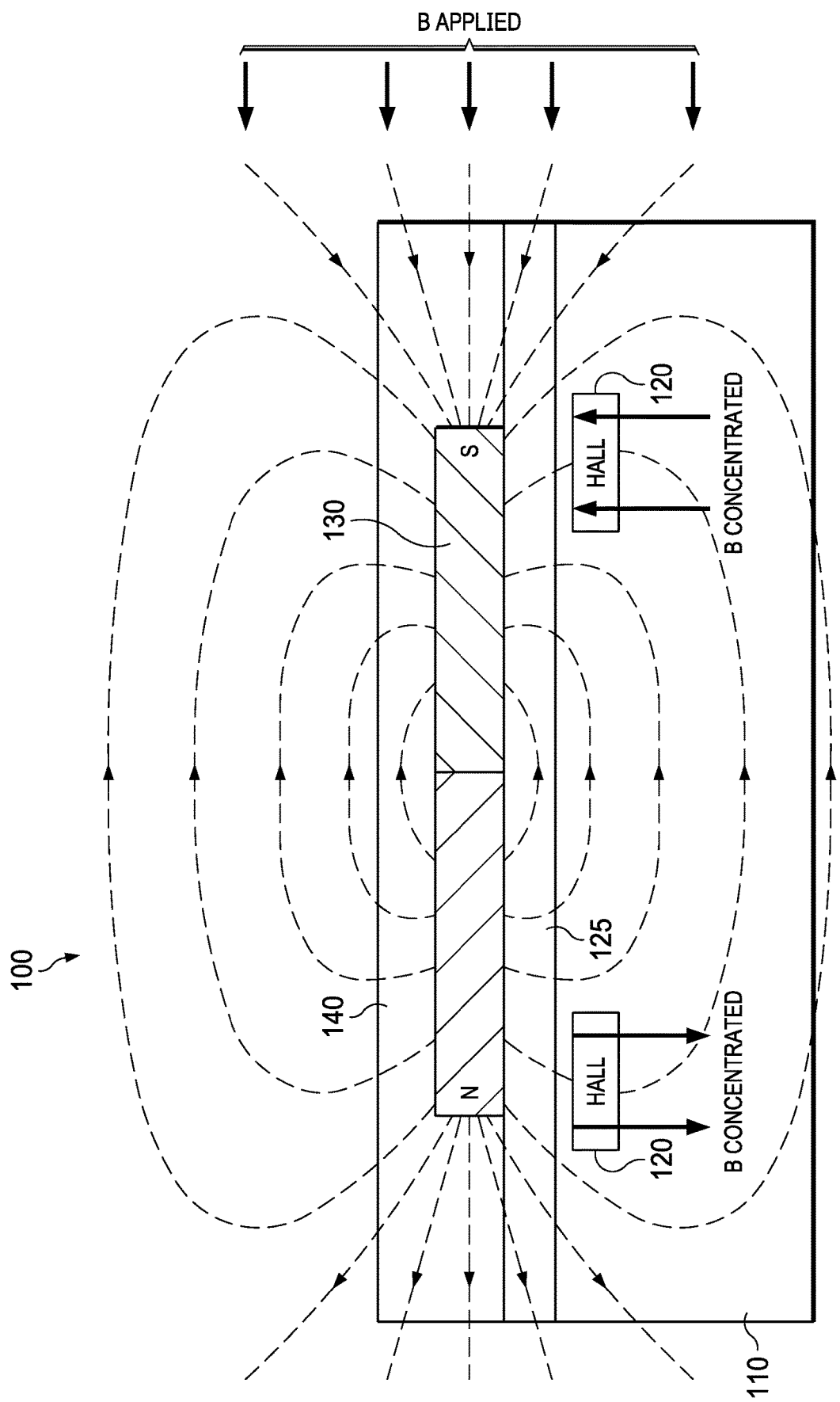
FIG. 1 is a cross-sectional schematic side view of a structure including a substrate, Hall sensors, a magnetic concentrator, and a protective overcoat layer.

In an example, FIG. 1 shows a cross-sectional schematic side view of a structure 100 including a substrate 110, Hall sensors 120, inter-level dielectric oxide layer 125, a magnetic concentrator 130, and a protective overcoat layer 140. The substrate 110 may include Si, glass, ceramic, etc. Below the surface of the substrate are two isolated horizontal Hall sensors 120. The Hall sensors 120 are electrically connected to a circuit (not shown) so that they can measure the magnetic field. The circuitry may be integrated on the substrate 110 (e.g., within the inter-level dielectric oxide layer 125) or may be positioned at a distant location (e.g., on another substrate).

During the wafer processing, before the protective overcoat layer 140 is formed, and after the Hall sensors 120 are placed within the substrate 110, the magnetic concentrator 130 is formed (by, for example, a deposition process such as electroplating, sputtering, or spraying) on the upper surface of the inter-level dielectric oxide 125 which is formed on the upper surface of the substrate 110. Alternatively, the magnetic concentrator 130 may be formed (using any of the above processes) on an optional stress-compensation layer 232 (such as SiN, see FIG. 2) which may be deposited on the upper surface of the inter-level dielectric oxide layer 125.

Figure 2:
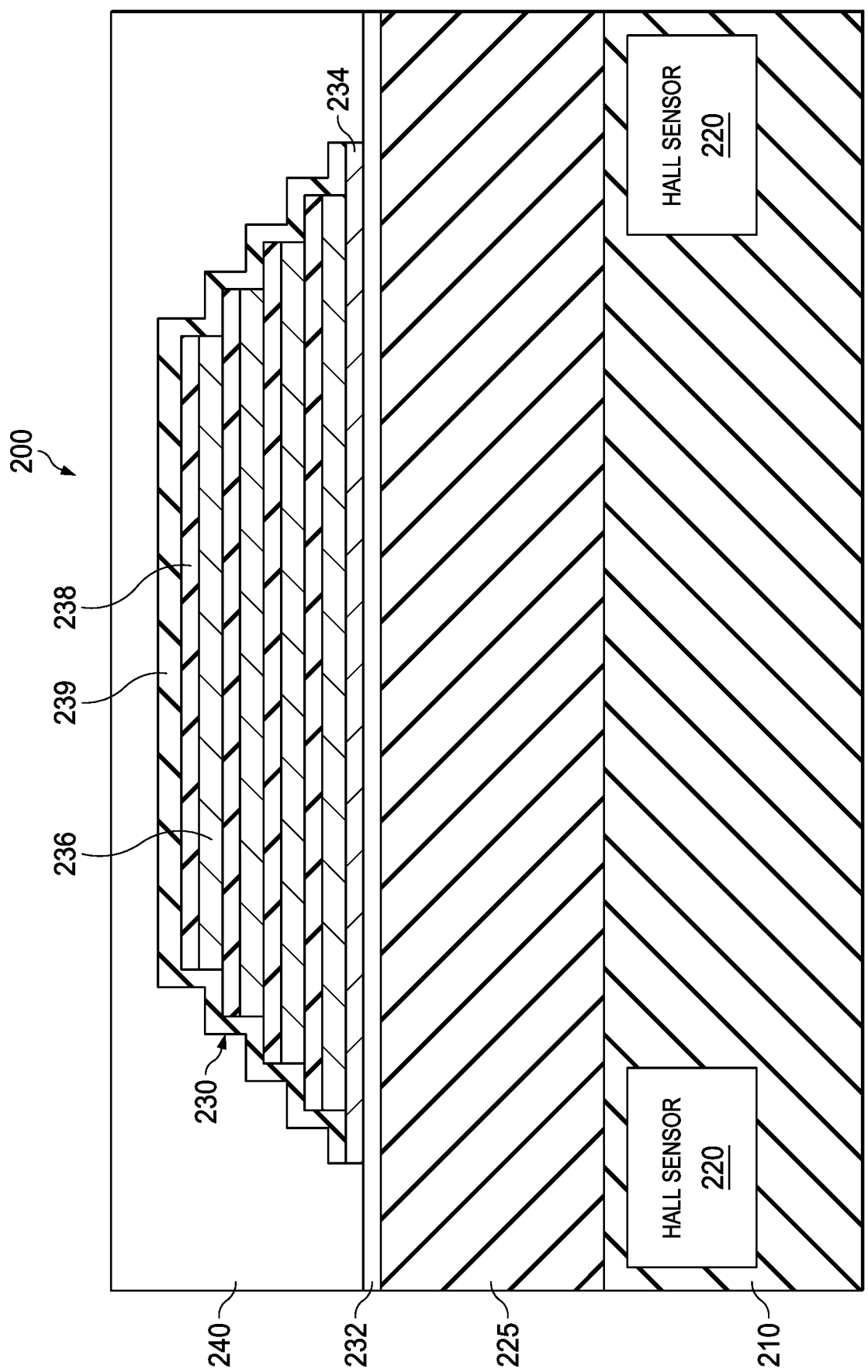
FIG. 2 is a cross-sectional schematic side view of a structure including a substrate, Hall sensors, inter-level dielectric oxide layer, optional stress-compensation layer (e.g., SiN), a magnetic concentrator, and a protective overcoat layer.

The magnetic concentrator may include only a single layer of magnetic material, or multiple layers of magnetic material as shown, for example, in FIG. 2. FIG. 2 shows a cross-sectional schematic side view of a structure 200 including a multilayered magnetic concentrator 230. The magnetic concentrator 230 includes multiple magnetic layers 236 such as a NiFe permalloy film (e.g., in a thickness of 330 nm). The bottom NiFe magnetic layer 236 is deposited on the upper surface of layer 234 comprising Ti or other metal (e.g., in a thickness of 60 nm) which is capable of serving as an electrode in an electroplating process. The Ti layer 234 is deposited on the upper surface of the inter-level dielectric oxide layer 225 (in any thickness) or optional stress-compensation layer 232 (e.g., in a thickness of 100 nm), if present. Above each of the NiFe magnetic layers 236 is an insulating layer 238 comprising dielectric material or high resistivity insulator material, such as AlN or $Al_2O_3$ (e.g., in a thickness of 10 nm). To complete the die, a protective overcoat layer 240 is deposited on the magnetic concentrator 230. Prior to the deposition of the overcoat layer 240, the magnetic concentrator 230 is patterned.

Multiple magnetic layers are employed in this example, because, inter alia, a thicker, and thus stronger, concentrator material is realized. A thicker magnetic concentrator also provides a higher saturation threshold. By providing multiple layers of magnetic material, the multilayered magnetic concentrator is made thicker and, as such, prevents saturation of the magnetic field within the magnetic concentrator. A higher saturation threshold enables the magnetic concentrator to withstand a measurably higher magnetic field input, thus resulting in a potentially higher magnetic field output. If the magnetic concentrator saturates, then the structure, including the substrate and Hall sensors, becomes non-linear and ceases to function. Thus, prevention of saturation within the magnetic concentrator is highly desirable.

Importantly, the magnetic concentrator is formed during the wafer-level processing. This wafer-level deposition process (in comparison to pick and place deposition) allows precision patterning of the magnetic concentrator to be employed. Patterning of the magnetic concentrator enables arbitrary shaping of the magnetic concentrator in the x-y direction, thereby achieving flexibility in the control of magnetic field enhancement. Specifically, the magnetic concentrator is located between the protective overcoat layer 240 and the inter-level dielectric oxide layer 225 (or optional stress-compensation layer 232, if present). The inter-level dielectric oxide layer 225 contains the metal routing for the Hall sensors and associated integrated circuits.

In one implementation the protective overcoat layer 240 is a layer of SiON or other dielectric material (e.g., in a thickness of 2.8 μm), though other thicknesses can alternatively be used. Locating the concentrator in this location (i.e., below the protective overcoat layer 240), rather than above the protective overcoat layer 240, increases the effectiveness of the magnetic concentrator by reducing the distance between the magnetic concentrator and the Hall sensors.

As also shown in FIG. 2, the magnetic concentrator 230 may include an outer layer 239 of, for example, Ti or other polymer (e.g., in a thickness of 135 nm). The Ti outer layer 239 serves as a protective layer surrounding the multiple NiFe magnetic layers 236. The Ti outer layer 239 protects the multiple NiFe magnetic layers 236 from mechanical damage during, for example, the packaging or other fabrication steps. The Ti outer layer 239 is patterned as well as the underlying Ti layer 234, particularly toward the sides of the multiple NiFe magnetic layers 236. The mask may extend the Ti out away from the NiFe layers by some distance.

As described above, the Ti layer 234 may be positioned between the bottom NiFe magnetic layer 236 and the underlying optional SiN stress-compensation layer 232. The Ti layer 234 may serve as an electrode in an electroplating process for the deposition of the multiple NiFe magnetic layers. The Ti layer 234 also blocks diffusion of the magnetic NiFe material into the underlying stress-compensation layer 232, during the deposition (e.g., electroplating or sputtering) process of the NiFe. Thus, the Ti layer 234 prevents NiFe from diffusing into the SiN, which would likely adversely affect the operation (and possibly the formation of) of the Hall sensors. The optional SiN stress-compensation layer 232 compensates for the mechanical stress that may be induced on the wafer during deposition of the magnetic concentrator 230. Instead of electroplating, sputtering may be used to deposit the NiFe and AlN layers, followed by a wet etch to pattern the NiFe layers. The wet etch on the laminated core results in the staircase sidewall shown in FIG. 2. A dry etch may alternatively be employed.

To effect patterning of the magnetic concentrator, during the electroplating process in the formation of the NiFe magnetic layers, a photoresist is employed to prevent deposition of NiFe on certain areas of the substrate. Stripping of the photoresist is performed subsequent to the electroplating, which creates the patterning of the magnetic concentrator. The patterning of the magnetic concentrator results in the formation of the magnetic concentrator having various shapes as described below.

Figure 5B:
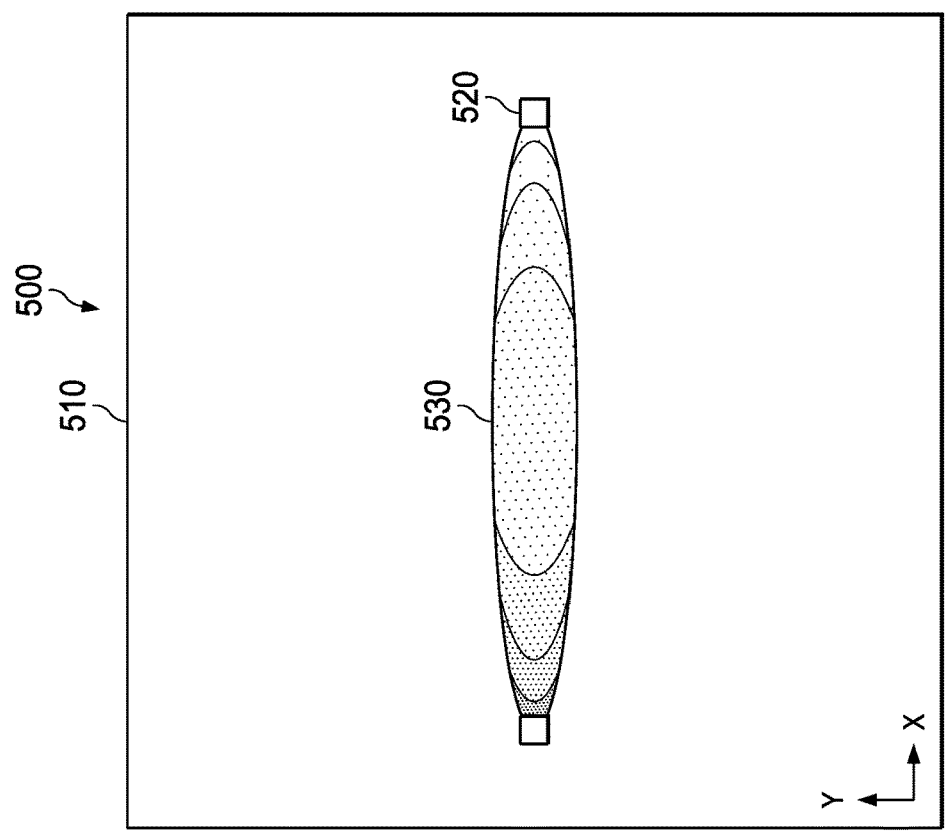
FIG. 5B is a top view of the structure shown in FIG. 5A, along with superimposed Hall sensors illustrating the x-y location of the Hall sensors within the structure.
Figure 5A:
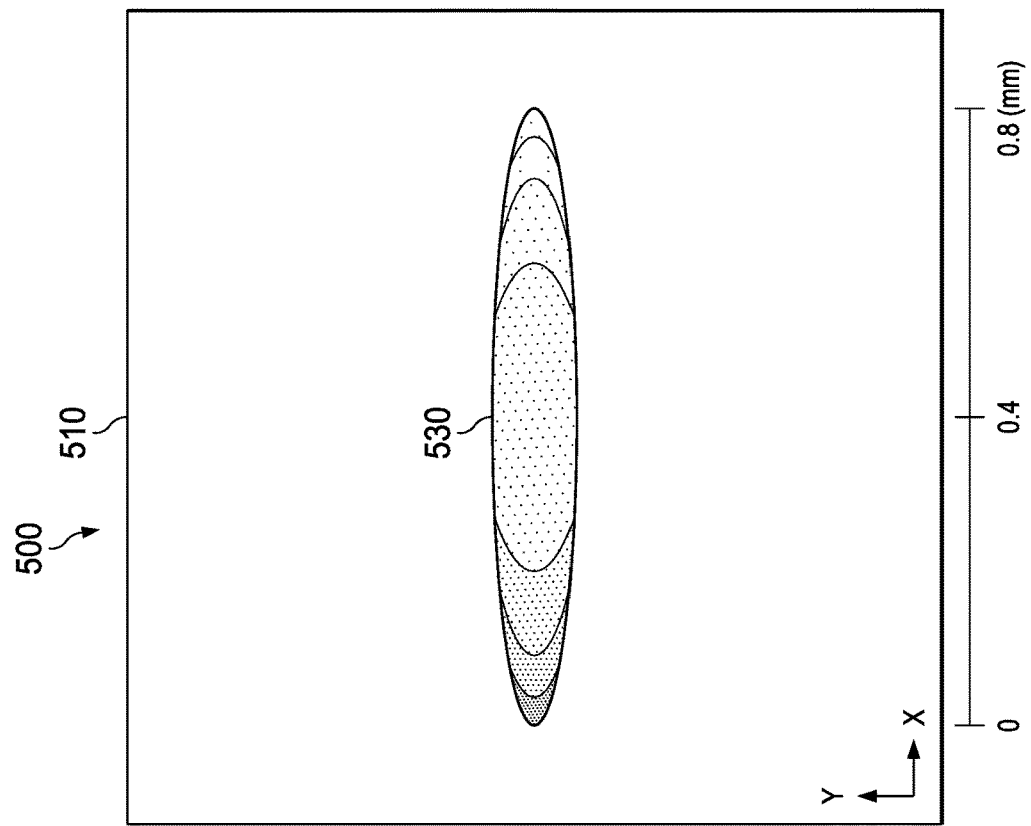
FIG. 5A is a top view of a structure including a magnetic concentrator in a shape of an ellipse. The protective overcoat layer is not shown.

In an example, FIG. 5A shows a top view of a structure 500 including a substrate 510 and a magnetic concentrator 530 in a shape of an ellipse. FIG. 5B is a top view of the structure 500 shown in FIG. 5A, along with superimposed Hall sensors 520 illustrating the x-y location of the Hall sensors 520 within the structure. The magnetic concentrator 530 may have a thickness/depth of, for example, in the range of 1-2 μm. The substrate may have a width in the range of 0.7 mm-2 mm and a depth/thickness in the range of 60-800 μm. The Hall sensors 520 may have a thickness (i.e., depth of the Hall well) in the range of 1-3 μm and may be spaced a distance of 3-5 μm from the substrate top surface. The protective overcoat layer (not shown) may have any thickness.

Figure 6B:
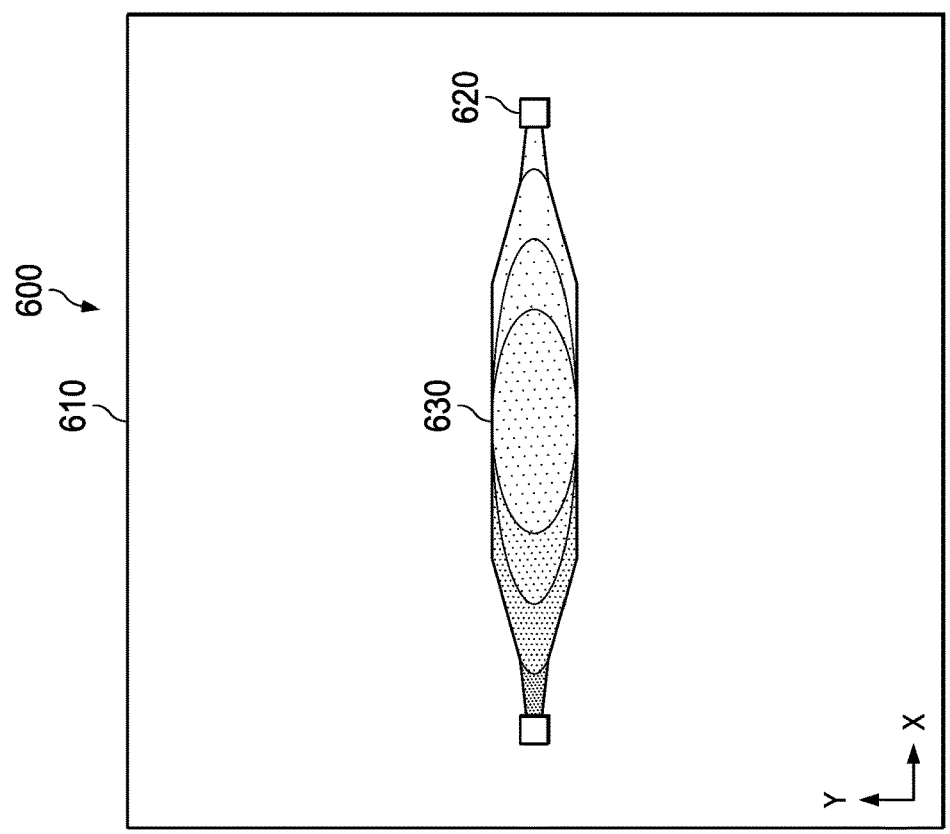
FIG. 6B is a top view of the structure shown in FIG. 6A, along with superimposed Hall sensors illustrating the x-y location of the Hall sensors within the structure.
Figure 6A:
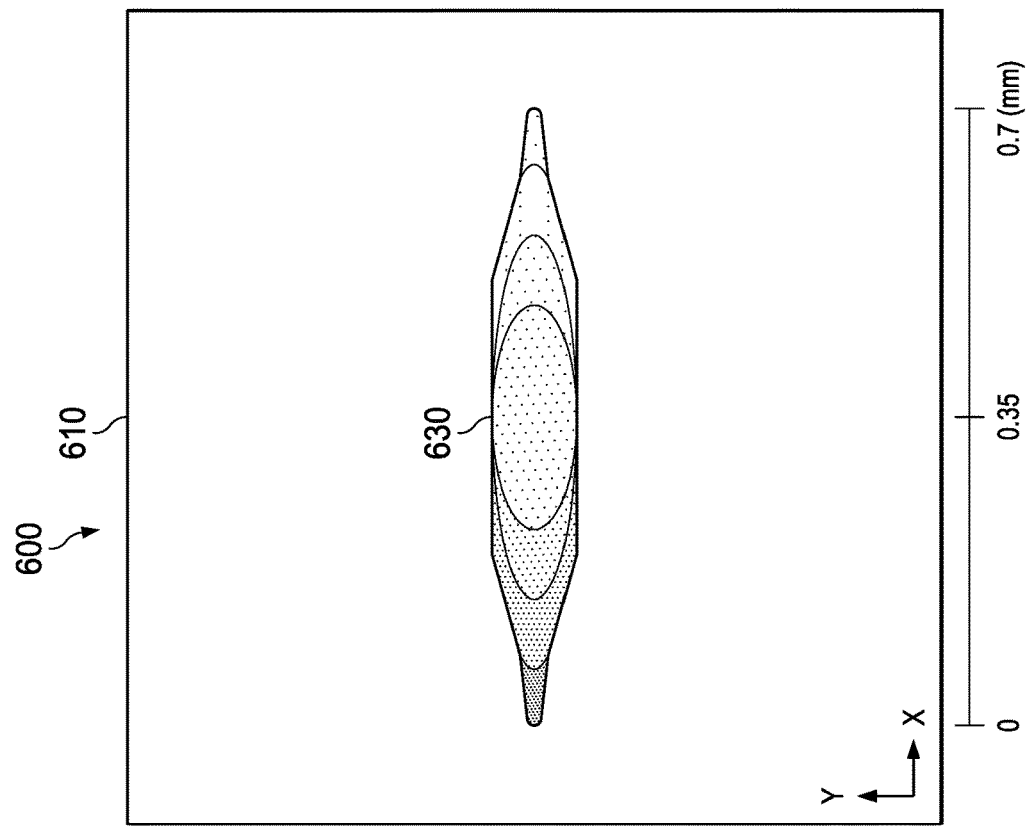
FIG. 6A is a top view of a structure including a magnetic concentrator in a shape of a wedge. The protective overcoat layer is not shown.

In an example, FIG. 6A shows a top view of a structure 600 including a substrate 610 and a magnetic concentrator 630 in a shape of a wedge. FIG. 6B is a top view of the structure 600 shown in FIG. 6A, along with superimposed Hall sensors 620 illustrating the x-y location of the Hall sensors 620 within the structure.

Figure 7B:
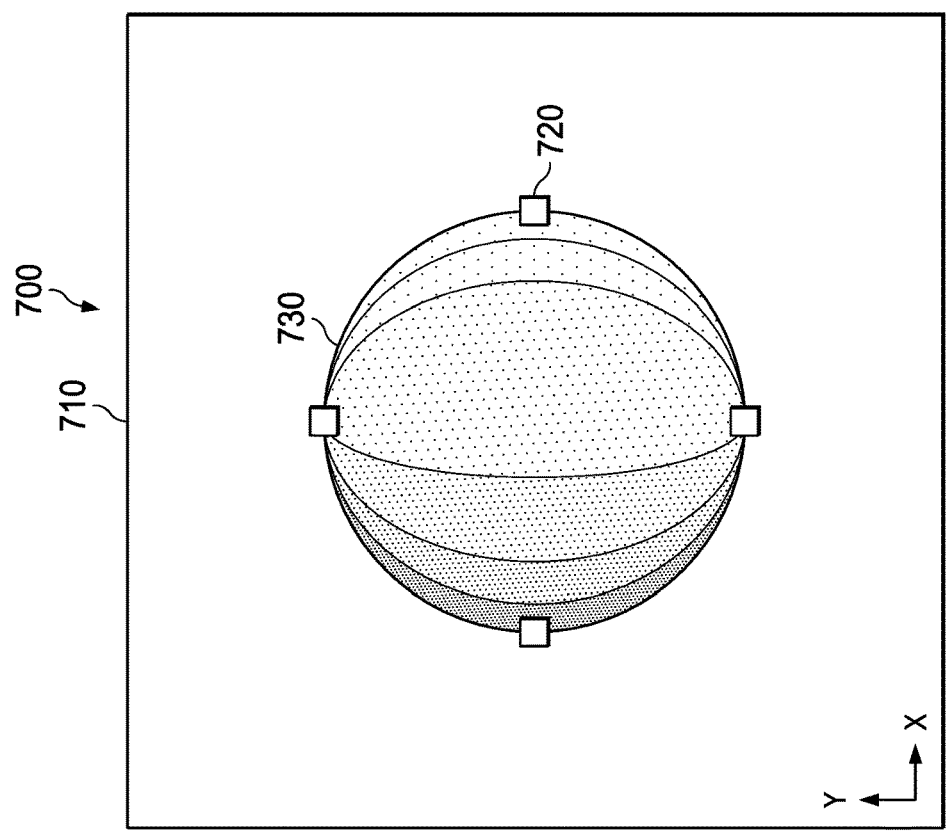
FIG. 7B is a top view of the structure shown in FIG. 7A, along with superimposed Hall sensors illustrating the x-y location of the Hall sensors within the structure.
Figure 7A:
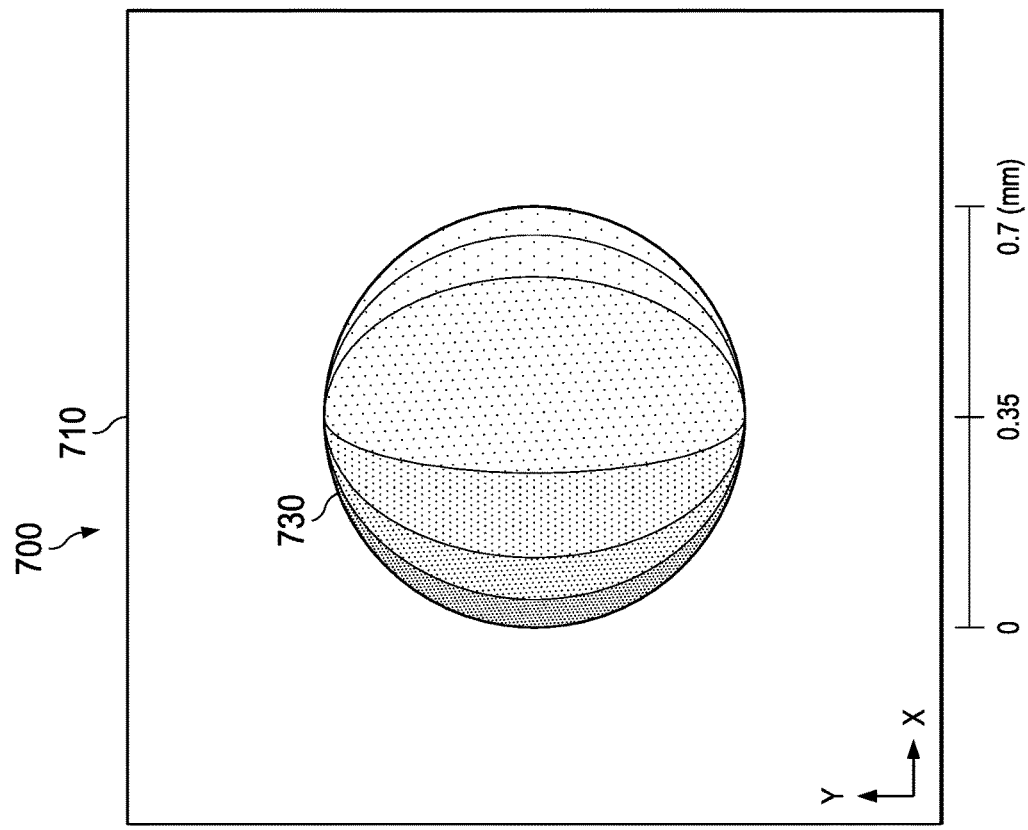
FIG. 7A is a top view of a structure including a magnetic concentrator in a shape of a circle. The protective overcoat layer is not shown.

In an example, FIG. 7A shows a top view of a structure 700 including a substrate 710 and a magnetic concentrator 730 in a shape of a circle. FIG. 7B is a top view of the structure 700 shown in FIG. 7A, along with superimposed Hall sensors 720 illustrating the x-y location of the Hall sensors 720 within the structure.

Figure 8B:
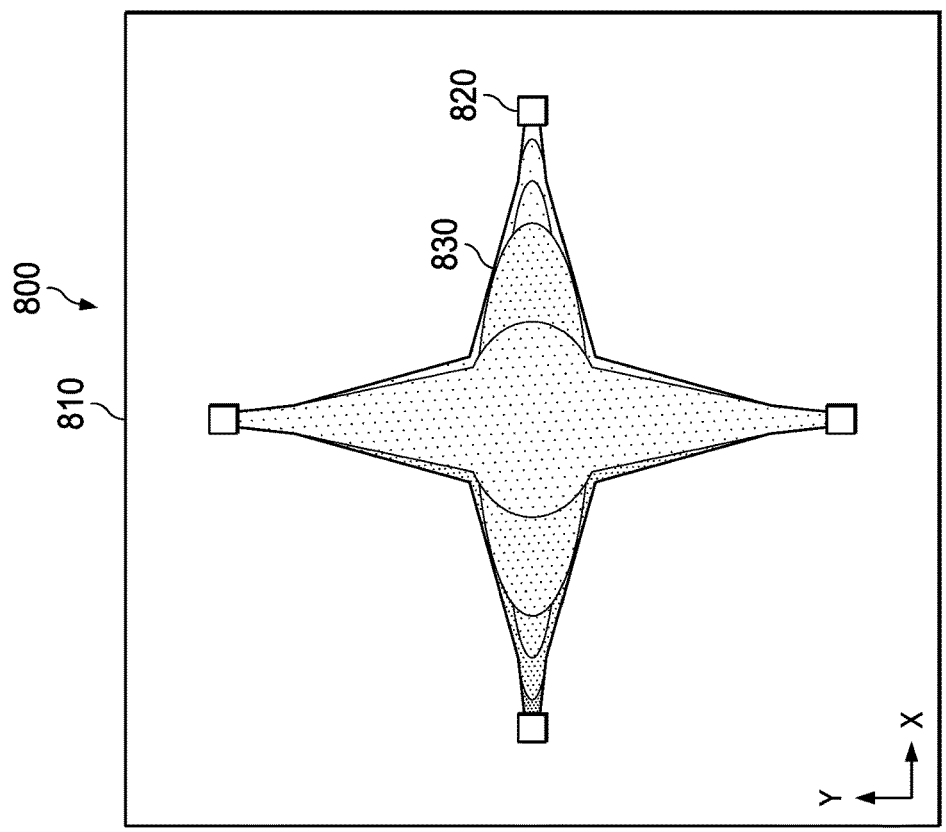
FIG. 8B is a top view of the structure shown in FIG. 8A, along with superimposed Hall sensors illustrating the x-y location of the Hall sensors within the structure.
Figure 8A:
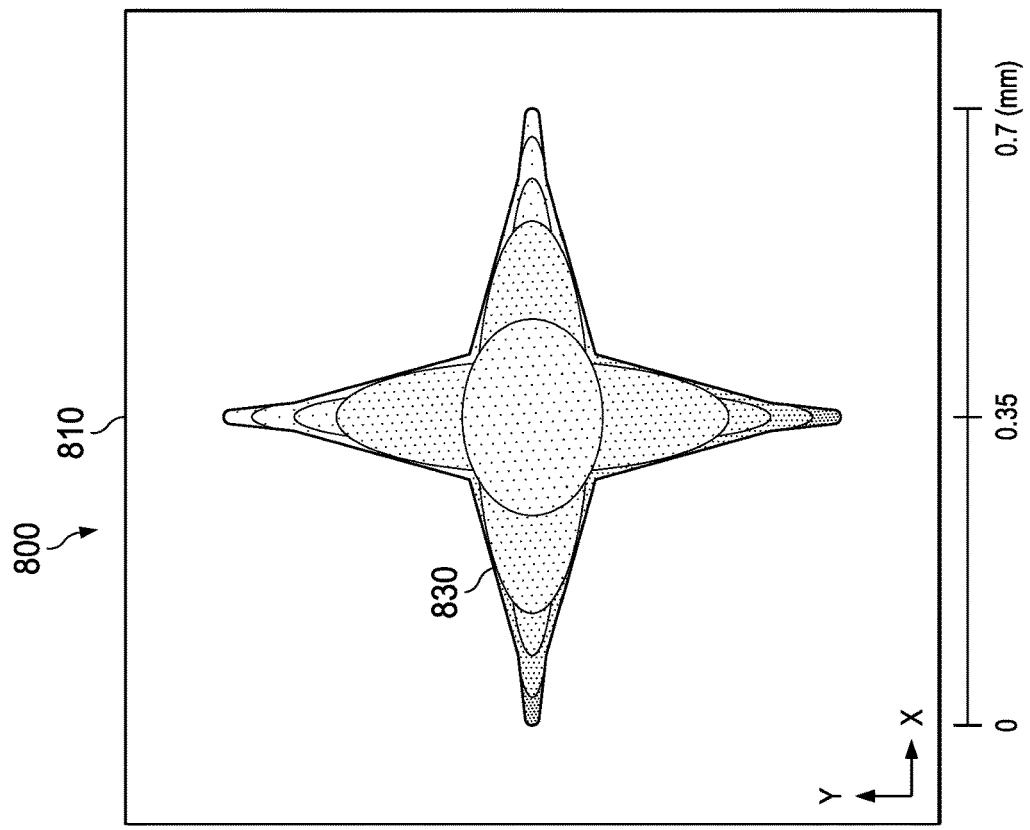
FIG. 8A is a top view of a structure including a magnetic concentrator in a shape of a cross. The protective overcoat layer is not shown.

In an example, FIG. 8A shows a top view of a structure 800 including a substrate 810 and a magnetic concentrator 830 in a shape of a cross. FIG. 8B is a top view of the structure 800 shown in FIG. 8A, along with superimposed Hall sensors 820 illustrating the x-y location of the Hall sensors 820 within the structure.

Figure 9B:
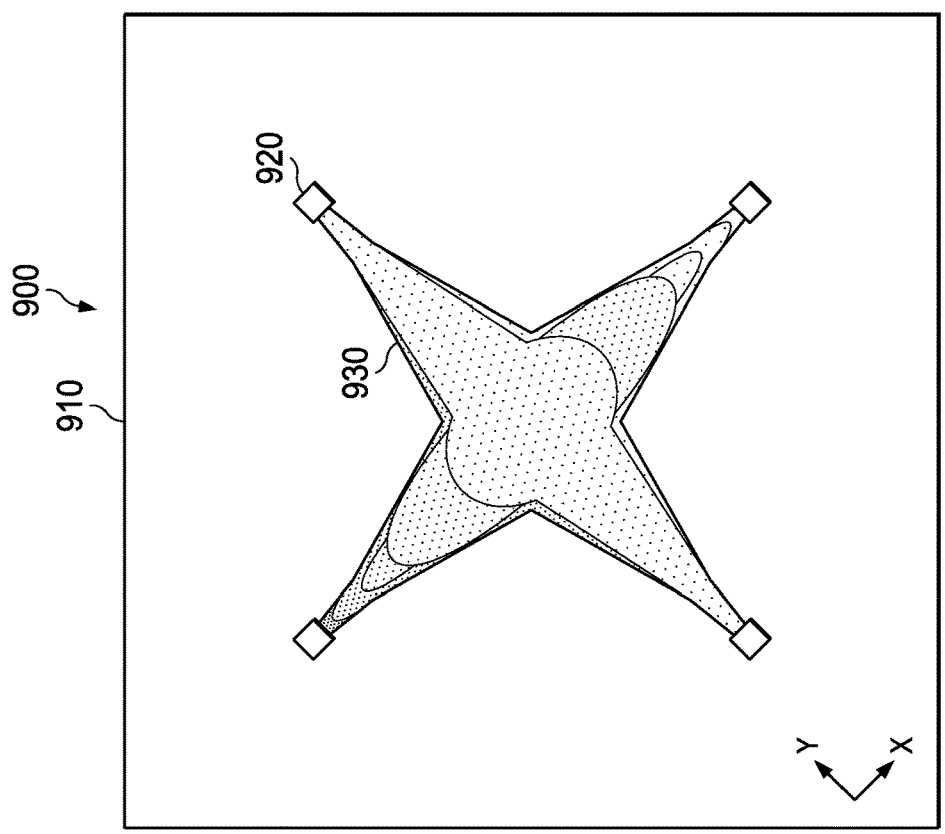
FIG. 9B is a top view of the structure shown in FIG. 9A, along with superimposed Hall sensors illustrating the x-y location of the Hall sensors within the structure.
Figure 9A:
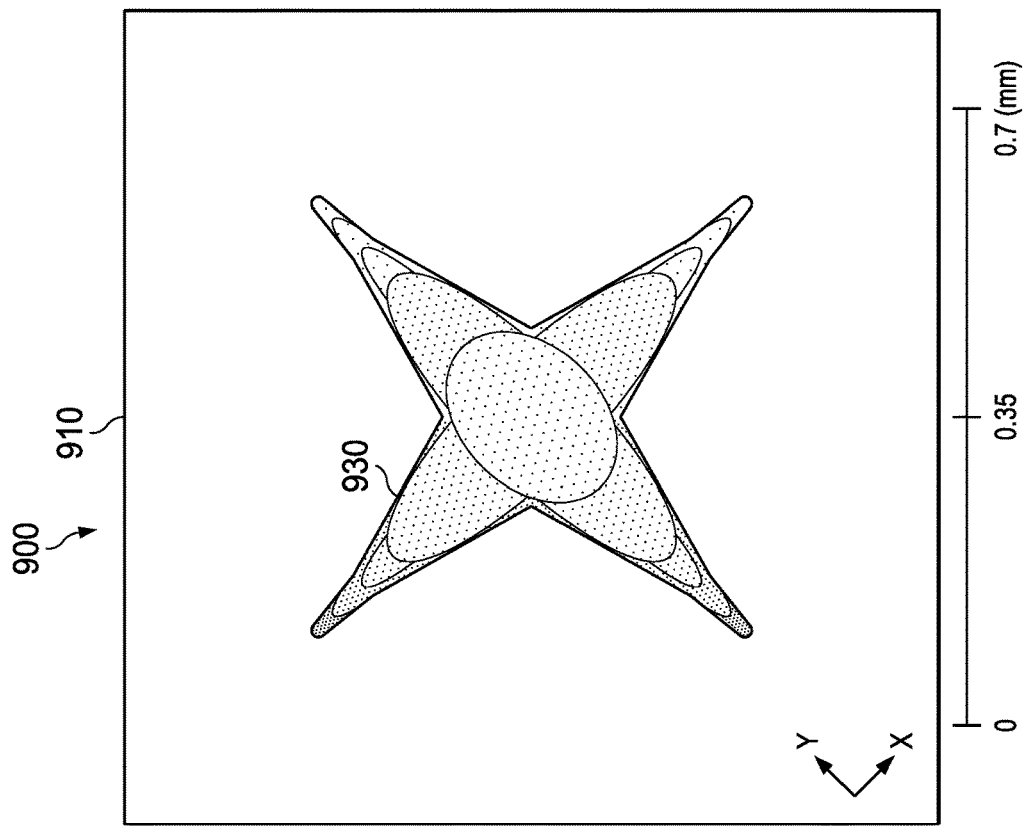
FIG. 9A is a top view of a structure including a magnetic concentrator in a shape of an "X". The protective overcoat layer is not shown.

In an example, FIG. 9A shows a top view of a structure 900 including a substrate 910 and a magnetic concentrator 930 in a shape of an "X". FIG. 9B is a top view of the structure 900 shown in FIG. 9A, along with superimposed Hall sensors 920 illustrating the x-y location of the Hall sensors 920 within the structure.

The various patterned shapes of the magnetic concentrator enable a higher structure sensitivity by enhancing/amplifying the magnetic field near the area of the hall sensors. Different magnetic concentrator shapes enhance the magnetic field by providing different magnetic field outputs while concentrating the outputs near the Hall sensors. Table 1 below indicates the maximum magnetic field output from a magnetic concentrator of various exemplary shapes (e.g., rectangular, ellipse, etc.), resulting from a 1 mT applied horizontal magnetic flux. For example, when a 1 mT horizontal magnetic flux is applied to an ellipse-shaped magnetic concentrator, the magnetic field output would be amplified to a maximum of 8.5 mT.

TABLE 1

Magnetic field enhancement/amplification dependent on shape of magnetic concentrator

| 1D/2D | Magnetic Concentrator Shape | Maximum Magnetic Field Output (1 mT Applied Horizontal Magnetic Flux) |
| --- | --- | --- |
| 1D | Rectangle | 6.7 mT |
| 1D | Ellipse | 8.5 mT |
| 1D | Wedge | 10 mT |
| 2D | Circle | 5.3 mT |
| 2D | X-Shape | 9 mT |
| 2D | Star | 14 mT |

A Hall sensor is positioned below each tip of the magnetic concentrator (see FIGS. 5B, 6B, 7B, 8B, and 9B). Any number of Hall sensors may be contemplated. However, 1D magnetic field measurements may be made with 1 or more Hall sensor(s). A single Hall sensor can be used to determine the direction of the magnetic field because the Hall voltage will change polarity with change in field direction. 2D magnetic field measurements may be made with 2 or more Hall sensors. 3D magnetic field measurements may be made with 4 or more Hall sensors.

With reference again to FIG. 1, when a magnetic field (B) is applied horizontally from the side, the magnetic concentrator 130 concentrates the magnetic field. Since the concentration occurs at the tip of the magnetic concentrator, the magnetic field will be bent and will generate the horizontal to vertical-direction conversion. With the conversion, the horizontally applied magnetic field (B) will loop and bend into a vertical magnetic field once the magnetic field enters the substrate. In other words, an in-plane (x-y) directional input magnetic field is converted to an out-of-plane (z) directional output magnetic field. The horizontal Hall sensors 120 are positioned within the vertical magnetic fields to maximize their measurements of the magnetic fields in the z-direction. Importantly, with this configuration, a vertical Hall sensor (which measures magnetic field applied horizontally from the side) is not required in the structure.

For simplicity, FIGS. 3-10 and 12 do not illustrate the protective overcoat layer.

In an example, FIG. 3 shows a top view of a structure 300 including a substrate 310 and a magnetic concentrator 330 in a shape of a cross, with a magnetic field input applied in a horizontal (X) direction. An applied magnetic field of 1 mT in the x direction will result in 14 mT maximum output in the z-direction. Up to 14× sensitivity enhancement/amplification of the magnetic field may be achieved with this structure.

In an example, FIG. 4 shows a top view of a structure 400 including a substrate 410 and a magnetic concentrator 430 in a shape of a cross, with a magnetic field input applied in a diagonal (x-y) direction. An applied magnetic field of 1 mT in the x-y direction will result in 10 mT maximum output in the z direction. Up to 10× sensitivity enhancement/amplification of the magnetic field may be achieved with this structure.

Figure 12:
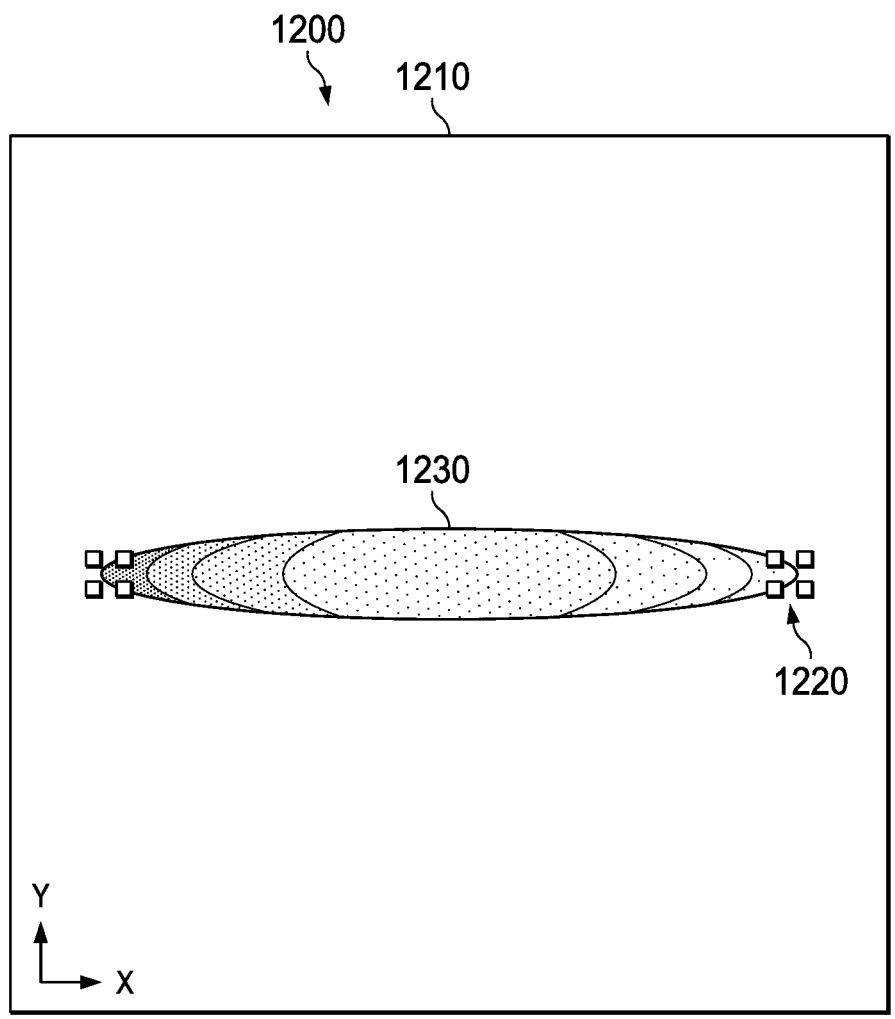
FIG. 12 is a top view of a structure including a magnetic concentrator in a shape of an ellipse, along with superimposed quad Hall sensor configurations illustrating the x-y location of the Hall sensors within the structure. The protective overcoat layer is not shown.

Hall sensors are shown in the figures as rectangle-shaped from the top view, but they may be other shapes such as a cross. Also, any of the single Hall sensors may alternatively be replaced with an array (i.e., two or more) of Hall sensors. The arrays (ensembles) are made by cross-connecting two or four sensors with each other in a particular array. The purpose of the arrays is to reduce offset and resistance. Offset negatively impacts sensor accuracy. And resistance introduces thermal noise and sets voltage headroom. In an example, FIG. 12 shows a top view of a structure 1200 including a substrate 1210 and a magnetic concentrator 1230 in a shape of an ellipse, along with superimposed quad Hall sensor configurations illustrating the x-y location of the Hall sensors within the structure. Specifically, an array 1220 of 4 Hall sensors (i.e., a quad) is positioned below each magnetic concentrator tip.

Figure 10:
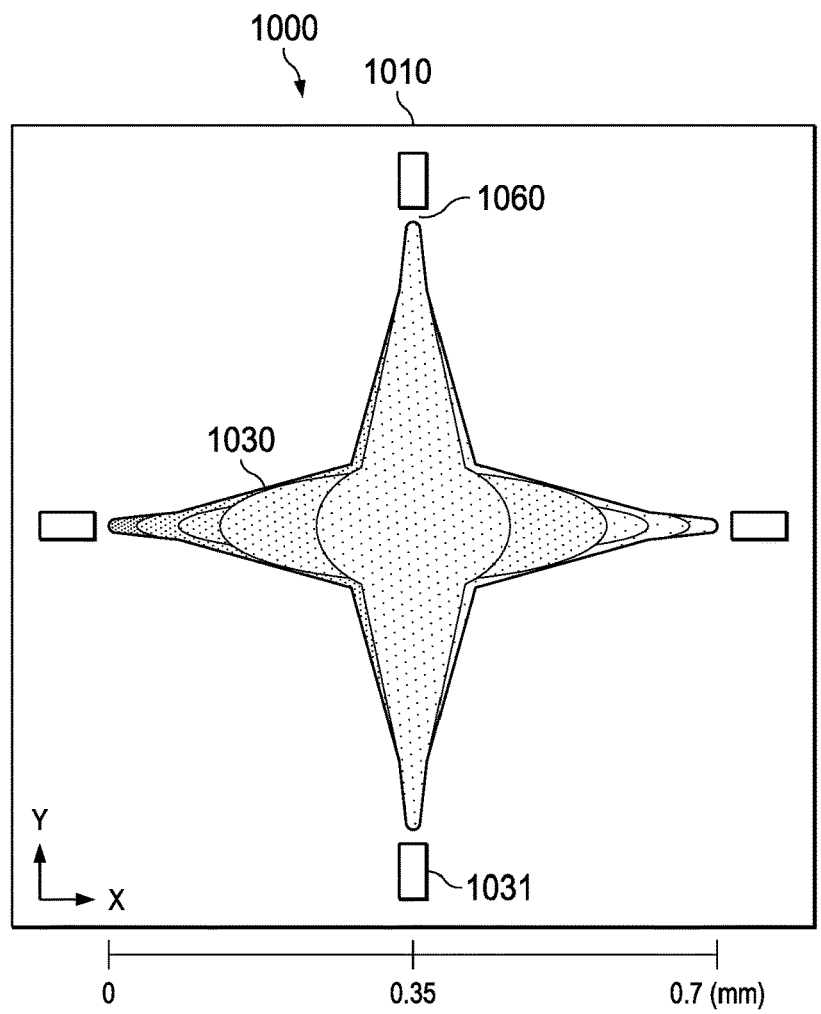
FIG. 10 is a top view of a structure including a magnetic concentrator in a shape of a cross, along with an additional magnetic concentrator in a shape of a rectangle spaced from each tip via a gap. The protective overcoat layer is not shown.

In an example, FIG. 10 shows a top view of a structure 1000 including a substrate 1010 and a magnetic concentrator 1030 in a shape of a cross, along with an additional magnetic concentrator 1031 in a shape of, for example, a rectangle spaced from each tip via a gap 1060. The use of the additional magnetic concentrators provide additional increase in the magnetic field output. The Hall sensors may be placed below the tips of the main/central magnetic concentrator as per any of the above examples, and they may optionally be provide below the gaps and/or below the additional magnetic concentrators.

Figure 11:
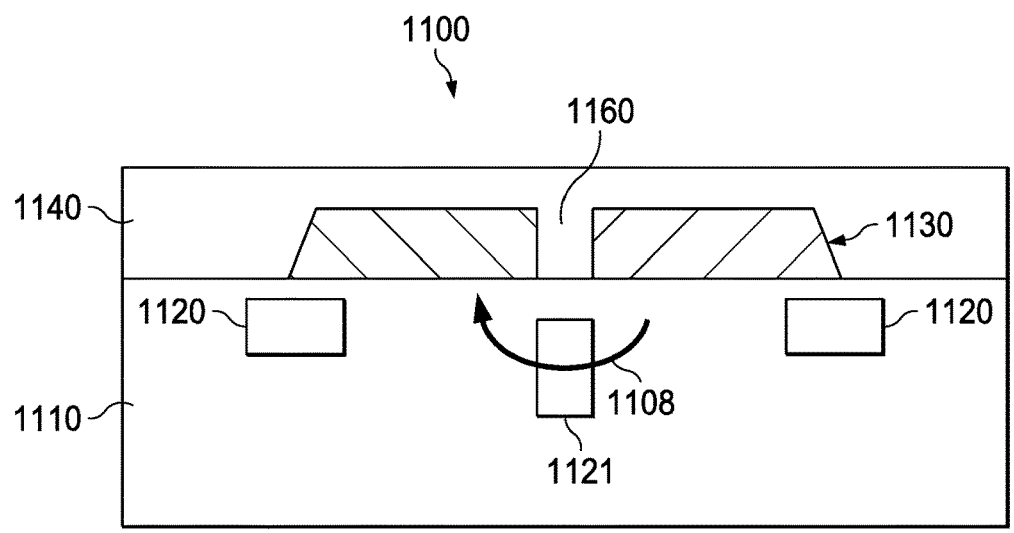
FIG. 11 is a cross-sectional schematic side view of a structure including a substrate, Hall sensors, a magnetic concentrator having a gap, and a protective overcoat layer.

In an example, FIG. 11 shows a cross-sectional schematic side view of a structure 1100 including a substrate 1110, horizontal Hall sensors 1120, a rectangular-shaped magnetic concentrator 1130 having a gap 1160, and a protective overcoat layer 1140. The Hall sensor 1121 below the gap 1160 is a vertical Hall sensor since it is positioned within a horizontal magnetic field 1108. In other examples, the vertical Hall sensor may be replaced with a horizontal Hall sensor for measuring and providing a different magnetic field effect. However, in any of the above examples, employing only horizontal Hall sensors eliminates the need to matching Hall sensors to each other in terms of calibrating, whereas employing both horizontal and vertical Hall sensors require calibrating, thereby adding significant complexity and time for wafer fabrication and packaging.

With reference to FIG. 1, in at least one example, a structure includes a substrate including a surface. The structure also includes a horizontal-type Hall sensor positioned within the substrate and below the surface of the substrate. The structure further includes a patterned magnetic concentrator positioned above the surface of the substrate, and a protective overcoat layer positioned above the magnetic concentrator.

The patterned magnetic concentrator may include multiple magnetic layers. The multiple magnetic layers may include a composition selected from the group consisting of Ni, Co, Fe, NiFe, CoNiFe, CoTaZr, and combinations thereof. The multiple magnetic layers may be separated from each other via an insulating layer including a composition selected from the group consisting of AlN, $Al_2O_3$ (or other dielectric material or high resistivity insulator material), and combinations thereof.

The patterned magnetic concentrator may further include an electrically conducting metal layer positioned below the multiple magnetic layers. The electrically conducting metal layer may include a composition selected from the group consisting of Ti, W, Cu, and combinations thereof.

The patterned magnetic concentrator may further include an outer layer at least partially encasing the multiple magnetic layers. The outer layer may include a composition selected from the group consisting of Ti, SiN, $SiO_2$, SiON, and combinations thereof.

The patterned magnetic concentrator may include a shape selected from the group consisting of non-circular, rectangle, ellipse, wedge, square, diamond, X-shaped, star, cross, triangle, hexagon, octagon, and combinations thereof.

In an example, the structure may further include a vertical-type Hall sensor positioned within the substrate and below the surface of the substrate. The patterned magnetic concentrator includes a gap at an inner portion of the patterned magnetic concentrator. The vertical-type Hall sensor is positioned below the gap. The horizontal-type Hall sensor includes multiple Hall sensors which are positioned below outer-edge portions, respectively, of the patterned magnetic concentrator.

With reference to FIG. 2, in another example, a method of forming a structure includes forming a substrate including a surface, positioning a horizontal-type Hall sensor within the substrate and below the surface of the substrate, forming a magnetic concentrator above the surface of the substrate, and forming a protective overcoat layer above the magnetic concentrator. The forming of the magnetic concentrator may include a deposition process selected from the group consisting of electroplating, sputtering, spraying, and combinations thereof. The forming of the magnetic concentrator may include patterning and etching the deposited magnetic concentrator thereby forming a patterned magnetic concentrator.

The magnetic concentrator may include multiple magnetic layers. The multiple magnetic layers may include a composition selected from the group consisting of Ni, Co, Fe, NiFe, CoNiFe, CoTaZr, and combinations thereof. The multiple magnetic layers may be separated from each other via an insulating layer including a composition selected from the group consisting of AlN, $Al_2O_3$ (or other dielectric material or high resistivity insulator material), and combinations thereof.

The magnetic concentrator may further include an electrically conducting metal layer positioned below the multiple magnetic layers. The electrically conducting metal layer may include a composition selected from the group consisting of Ti, W, Cu, and combinations thereof.

The magnetic concentrator may further include an outer layer at least partially encasing the multiple magnetic layers. The outer layer may include a composition selected from the group consisting of Ti, SiN, $SiO_2$, SiON, and combinations thereof.

The patterned magnetic concentrator may include a shape selected from the group consisting of circular, non-circular, rectangle, ellipse, wedge, square, diamond, X-shaped, star, cross, triangle, hexagon, octagon, and combinations thereof.

In an example, the method of forming a structure may further include positioning a vertical-type Hall sensor within the substrate and below the surface of the substrate. The patterned magnetic concentrator includes a gap at an inner portion of the patterned magnetic concentrator. The vertical-type Hall sensor is positioned below the gap. The horizontal-type Hall sensor includes multiple Hall sensors which are positioned below outer-edge portions, respectively, of the patterned magnetic concentrator.

With reference to FIG. 3, in yet another example, a method includes applying a substantially horizontal magnetic field to a patterned magnetic concentrator which converts the substantially horizontal magnetic field to a substantially vertical magnetic field. The patterned magnetic concentrator is positioned below a protective overcoat layer and above a surface of a substrate. The substantially vertical magnetic field is applied to two horizontal-type Hall sensors positioned within the substrate and below the surface of the substrate. The method also includes sensing the substantially vertical magnetic field using the two horizontal-type Hall sensors. The patterned magnetic concentrator may include multiple magnetic layers.

The use of a patterned magnetic concentrator allows amplification of the signal in the conversion from the horizontal to the vertical magnetic field, during operation of the structure. The magnetic concentrator may amplify the substantially horizontal magnetic field by a factor in a range of 2-20 (depending on the patterned magnetic concentrator shape) thereby providing the substantially vertical magnetic field. Some shapes might produce conversion factors less than 2, which would still prove to be useful.

The patterned magnetic concentrator may include a shape selected from the group consisting of circular, non-circular, rectangle, ellipse, wedge, square, diamond, X-shaped, star, cross, triangle, hexagon, octagon, and combinations thereof.

As described in the examples above, a magnetic concentrator deposited on a substrate surface converts horizontal-direction magnetic flux into vertical-direction magnetic flux. This enables horizontal-direction (in-plane) magnetic flux measurement using horizontal Hall sensor(s). Also, pattering the magnetic concentrator into certain shapes enables magnetic field concentration to be enhanced near the Hall sensor area(s).

It is noted that while four terminals and a rectangular shape are typical for a Hall sensor, Hall sensors with other numbers of terminals and/or shapes may be contemplated in this description. An example is an eight-terminal octagon.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A structure, comprising:
a substrate comprising a surface;
a horizontal-type Hall sensor positioned within the substrate and below the surface of the substrate;
a patterned magnetic concentrator positioned above the surface of the substrate; and
a protective overcoat layer positioned above the magnetic concentrator;
wherein the patterned magnetic concentrator comprises multiple magnetic layers;
wherein the multiple magnetic layers comprise a composition selected from the group consisting of Ni, Co, Fe, NiFe, CoNiFe, CoTaZr, and combinations thereof, and wherein the multiple magnetic layers are separated from each other via an insulating layer comprising a composition selected from the group consisting of AlN, $Al_2O_3$, and combinations thereof.

2. A structure, comprising:
a substrate comprising a surface;
a horizontal-type Hall sensor positioned within the substrate and below the surface of the substrate;
a patterned magnetic concentrator positioned above the surface of the substrate; and
a protective overcoat layer positioned above the magnetic concentrator;
wherein the patterned magnetic concentrator comprises multiple magnetic layers;
wherein the patterned magnetic concentrator further comprises an electrically conducting metal layer positioned below the multiple magnetic layers, and wherein the electrically conducting metal layer comprises a composition selected from the group consisting of Ti, W, Cu, and combinations thereof.

3. A structure, comprising:
a substrate comprising a surface;
a horizontal-type Hall sensor positioned within the substrate and below the surface of the substrate;
a patterned magnetic concentrator positioned above the surface of the substrate; and
a protective overcoat layer positioned above the magnetic concentrator;
wherein the patterned magnetic concentrator comprises multiple magnetic layers;
wherein the patterned magnetic concentrator further comprises an outer layer at least partially encasing the multiple magnetic layers, and wherein the outer layer comprises a composition selected from the group consisting of Ti, SiN, $SiO_2$, SiON, and combinations thereof.

4. A structure, comprising:
a substrate comprising a surface;
a horizontal-type Hall sensor positioned within the substrate and below the surface of the substrate;
a patterned magnetic concentrator positioned above the surface of the substrate;
a protective overcoat layer positioned above the magnetic concentrator; and
a vertical-type Hall sensor positioned within the substrate and below the surface of the substrate, wherein the patterned magnetic concentrator comprises a gap at an inner portion of the patterned magnetic concentrator, wherein the vertical-type Hall sensor is positioned below the gap, and wherein the horizontal-type Hall sensor comprises multiple Hall sensors which are positioned below outer-edge portions, respectively, of the patterned magnetic concentrator.

5. A method of forming a structure, the method comprising:
forming a substrate comprising a surface;
positioning a horizontal-type Hall sensor within the substrate and below the surface of the substrate;
forming a magnetic concentrator above the surface of the substrate; and
forming a protective overcoat layer above the magnetic concentrator;
wherein the magnetic concentrator comprises multiple magnetic layers;
wherein the multiple magnetic layers comprise a composition selected from the group consisting of Ni, Co, Fe, NiFe, CoNiFe, CoTaZr, and combinations thereof, and wherein the multiple magnetic layers are separated from each other via an insulating layer comprising a composition selected from the group consisting of AlN, $Al_2O_3$, and combinations thereof.

6. A method of forming a structure, the method comprising:
forming a substrate comprising a surface;
positioning a horizontal-type Hall sensor within the substrate and below the surface of the substrate;
forming a magnetic concentrator above the surface of the substrate; and
forming a protective overcoat layer above the magnetic concentrator;
wherein the magnetic concentrator comprises multiple magnetic layers;
wherein the magnetic concentrator further comprises an electrically conducting metal layer positioned below the multiple magnetic layers, and wherein the electrically conducting metal layer comprises a composition selected from the group consisting of Ti, W, Cu, and combinations thereof.

7. A method of forming a structure, the method comprising:
- forming a substrate comprising a surface;
- positioning a horizontal-type Hall sensor within the substrate and below the surface of the substrate;
- forming a magnetic concentrator above the surface of the substrate; and
- forming a protective overcoat layer above the magnetic concentrator;
- wherein the magnetic concentrator comprises multiple magnetic layers;
- wherein the magnetic concentrator further comprises an outer layer at least partially encasing the multiple magnetic layers, and wherein the outer layer comprises a composition selected from the group consisting of Ti, SiN, $SiO_2$, SiON, and combinations thereof.

8. A method of forming a structure, the method comprising:
- forming a substrate comprising a surface;
- positioning a horizontal-type Hall sensor within the substrate and below the surface of the substrate;
- forming a magnetic concentrator above the surface of the substrate;
- forming a protective overcoat layer above the magnetic concentrator; and
- positioning a vertical-type Hall sensor within the substrate and below the surface of the substrate, wherein the patterned magnetic concentrator comprises a gap at an inner portion of the patterned magnetic concentrator, wherein the vertical-type Hall sensor is positioned below the gap, and wherein the horizontal-type Hall sensor comprises multiple Hall sensors which are positioned below outer-edge portions, respectively, of the patterned magnetic concentrator.

* * * * *